(12) United States Patent
Chen et al.

(10) Patent No.: US 12,336,393 B2
(45) Date of Patent: Jun. 17, 2025

(54) LIGHT-EMITTING DEVICE, SUBSTRATE THEREOF AND FABRICATION METHOD

(71) Applicant: GUANGDONG JUHUA PRINTED DISPLAY TECHNOLOGY CO., LTD, Guangdong (CN)

(72) Inventors: Yawen Chen, Guangzhou (CN); Wen Shi, Guangzhou (CN)

(73) Assignee: GUANGDONG JUHUA PRINTED DISPLAY TECHNOLOGY CO., LTD, Guangdong (CN)

( * ) Notice: Subject to any disclaimer, the term of this patent is extended or adjusted under 35 U.S.C. 154(b) by 625 days.

(21) Appl. No.: 17/636,695

(22) PCT Filed: Nov. 10, 2020

(86) PCT No.: PCT/CN2020/127674
§ 371 (c)(1),
(2) Date: Feb. 18, 2022

(87) PCT Pub. No.: WO2021/129199
PCT Pub. Date: Jul. 1, 2021

(65) Prior Publication Data
US 2022/0293699 A1 Sep. 15, 2022

(30) Foreign Application Priority Data
Dec. 27, 2019 (CN) .......................... 201911379831.3

(51) Int. Cl.
*H10K 59/124* (2023.01)
*H10K 59/12* (2023.01)
*H10K 71/00* (2023.01)

(52) U.S. Cl.
CPC ........... *H10K 59/124* (2023.02); *H10K 59/12* (2023.02); *H10K 71/00* (2023.02); *H10K 59/1201* (2023.02)

(58) Field of Classification Search
CPC ............. H01L 27/1288; H01L 21/0273; H01L 21/0271; H01L 21/0274; G03F 1/32; G03F 1/136236; H10D 86/0231
See application file for complete search history.

(56) References Cited

U.S. PATENT DOCUMENTS

2014/0085742 A1 3/2014 Qi et al.
2021/0408474 A1* 12/2021 Zou ...................... H10K 50/824

FOREIGN PATENT DOCUMENTS

CN 101359634 A 2/2009
CN 106057827 A 10/2016
(Continued)

OTHER PUBLICATIONS

Machine Translation Interpretation CN-106816558 (Year: 2017).*
(Continued)

*Primary Examiner* — Jesse Y Miyoshi
*Assistant Examiner* — Ricky Verdes
(74) *Attorney, Agent, or Firm* — Dorsey & Whitney LLP

(57) ABSTRACT

A fabrication method for a substrate of a light-emitting device comprises: fabricating an organic photoresist layer on the surface of a substrate provided with a protruding structure, so that the organic photoresist layer covers the protruding structure, wherein by means of semi-exposing, developing and removing a portion of the thickness of a specific region of the organic photoresist layer, the specific region is a region of the organic photoresist layer that covers the protruding structure; and post-bake curing the remaining portion of the organic photoresist layer to form a planarization layer.

18 Claims, 3 Drawing Sheets

(56) References Cited

FOREIGN PATENT DOCUMENTS

| | | | |
|---|---|---|---|
| CN | 106229296 A | | 12/2016 |
| CN | 106816558 A | * | 6/2017 |
| CN | 107026121 A | | 8/2017 |
| WO | 2017210926 A1 | | 12/2017 |
| WO | 2019140733 A1 | | 7/2019 |
| WO | 2019214580 A1 | | 11/2019 |

OTHER PUBLICATIONS

International Search Report and Written Opinion for International Application No. PCT/CN2020/127674, mailed Feb. 8, 2021.
First Office Action for Chinese Application No. 201911379831.3 mailed Jun. 6, 2022.

* cited by examiner

LIGHT-EMITTING DEVICE, SUBSTRATE THEREOF AND FABRICATION METHOD

CROSS-REFERENCE TO RELATED APPLICATION

This application is a U.S. National Stage of PCT International Application No. PCT/CN2020/127674 filed on Nov. 10, 2020, which claims priority to Chinese Patent Application No. 2019113798313, filed on Dec. 27, 2019, entitled "LIGHT-EMITTING DEVICE, SUBSTRATE OF LIGHT-EMITTING DEVICE, AND METHODS FOR FABRICATING LIGHT-EMITTING DEVICE AND SUBSTRATE", the entire content of which is incorporated herein by reference.

TECHNICAL FIELD

The present disclosure relates to the field of light-emitting devices, in particular to a light-emitting device, a substrate of the light-emitting device, and methods for fabricating the light-emitting device and the substrate.

BACKGROUND

Organic light-emitting diodes (OLEDs) and quantum dot light-emitting diodes (QLEDs) have advantages of self-luminescence, fast response, wide viewing angle, high brightness, lightness and thinness, and the like, and thus have become two main research aspects of current display devices. A solution processing method is used to fabricate an OLED display and a QLED display, which is an important aspect for future display technology development due to the advantages of low cost, high yield, easy realization of large sizes, and the like.

When a configuration of a top-emitting device is adopted, a larger aperture ratio of a display panel can be obtained. However, in the configuration of the top-emitting device, wiring, capacitors, and part of a thin film transistor array are located under a light-emitting unit, resulting in an uneven anode. Since the thin-film transistor array is formed with many film layers, and a light-shielding layer and a source-drain electrode layer are located under the light-emitting unit, a level of overall film layer in this region is high, and thus a level of the corresponding anode is high in this region, resulting in a level difference in the anode. FIG. 1 shows a structure of a capacitor of a thin film transistor with a top-gate structure formed on a substrate 12, where a protruding portion 13 is mainly formed by a capacitor formed by a light-shielding layer 14, a gate insulating layer 15, and a source-drain electrode 16. The protruding portion 13 protrudes from a protective layer 17 covering thereon. After the anode is formed, a thickness of a portion of the electrode above the protruding portion 13 is different from a thickness of other portion of the electrode above the other regions, which will eventually lead to the nonuniformity of light emission within a pixel, and which is very disadvantageous for, especially, a display device fabricated by a printing process. In addition, the existence of the level difference will further deteriorate the film formation uniformity in the pixel, and finally affect the display effect of the panel. The inventor's research has found that, the level difference still occurs when the anode is deposited on the planarization layer after the planarization is carried out by coating the organic photoresist material after the protective layer of the thin film transistor is fabricated and drying the organic photoresist material to form the planarization layer. Generally, the level of reducing the level difference is at most about 80%, the planarization effect is very unsatisfactory.

SUMMARY

Accordingly, it is necessary to provide a light-emitting device, a substrate of the light-emitting device, and methods for fabricating the light-emitting device and the substrate, to address the problem that a conventional method of forming a planarization layer has an unsatisfactory planarization effect.

A method for fabricating a substrate of a light-emitting device includes:
fabricating an organic photoresist layer on a surface of a substrate having a protruding portion, and enabling the organic photoresist layer to cover the protruding portion;
removing a portion with a certain thickness of a specific region of the organic photoresist layer by half-exposure and development, the specific region being a region of the organic photoresist layer covering the protruding portion; and
post-drying and curing the remaining portion of the organic photoresist layer to form a planarization layer.

In one of the embodiments, in the removing the portion with the certain thickness of the specific region of the organic photoresist layer by half-exposure and development, the thickness is calculated according to a condition (I):

$$C = m \cdot (D/X - D), \quad (I)$$

wherein C is the thickness of the portion of the specific region of the organic photoresist layer removed by half-exposure and development, D is a height of the protruding portion protruding from the surface of the substrate, and X is a curing shrinkage rate of a material of the organic photoresist layer, $0.5 < m \leq 1.5$.

In one of the embodiments, $0.8 < m \leq 1.2$.

In one of the embodiments, $m = 1$.

In one of the embodiments, the method further includes, prior to the post-drying and curing: fabricating a via hole in a region of the organic photoresist layer other than the specific region. The via hole is configured for being electrically connected to a source-drain of a TFT driving array.

In one of the embodiments, a TFT driving array is disposed on the substrate, and the protruding portion is formed by protruding the TFT driving array from the surface of the substrate.

In one of the embodiments, the organic photoresist layer is made of a positive organic photoresist material.

A substrate of a light-emitting device is configured to be fabricated by the method according to any one of embodiments.

A light-emitting device includes: the substrate as described above; a first electrode disposed on the planarization layer; a light-emitting functional layer disposed on the first electrode; and a second electrode disposed on the light-emitting functional layer.

A method for fabricating a light-emitting device includes:
fabricating an organic photoresist layer on a surface of a substrate having a protruding portion, and enabling the organic photoresist layer to cover the protruding portion;
removing a portion with a certain thickness of a specific region of the organic photoresist layer by half-exposure and development, the specific region being a region of the organic photoresist layer covering the protruding portion;

post-drying and curing the remaining portion of the organic photoresist layer to form a planarization layer;

fabricating a first electrode on the planarization layer;

fabricating a light-emitting functional layer on the first electrode; and fabricating a second electrode on the light-emitting functional layer.

Compared with the conventional schemes, the light-emitting device, the substrate of the light-emitting device, and methods for fabricating the light-emitting device and the substrate have advantageous effects as follows.

The inventors of the present disclosure have found that the causes for the level difference in the planarization layer include the volatilization of the solvent during the film formation of the organic photoresist material, and the shrinkage of the film in the thickness direction during curing. The above method for fabricating the substrate of the light-emitting device forms the organic photoresist layer by pre-drying the coating layer including the organic photoresist material and the solvent to remove the solvent, so as to avoid the volatilization of the solvent from affecting the uneven film formation during the direct curing. Then, the organic photoresist material of the portion with a certain thickness of a region (the specific region) on the organic photoresist layer, corresponding to the protruding portion, is removed by half-exposure and development, which reduces the effect of uneven film formation caused by the difference in shrinkage between the organic photoresist material of this specific region and the organic photoresist material of other region during curing. As a result, the planarization layer with higher flatness is formed. The first electrode is deposited on this planarization layer, finally the flat first electrode with almost no level difference can be obtained, thereby improving the uniformity of light emission of the light-emitting device.

DETAILED DESCRIPTION OF THE EMBODIMENTS

In order to facilitate understanding of the present disclosure, the present disclosure will be described more fully below with reference to the related drawings. Preferred embodiments of the present disclosure are shown in the accompanying drawings. However, the disclosure may be implemented in many different forms and is not limited to the embodiments described herein. Rather, these embodiments are provided so that the contents of this disclosure can be understood more thorough and complete.

Unless otherwise defined, all technical and scientific terms used herein have the same meaning as commonly understood by one of ordinary skill in the technical field to which this disclosure belongs. The terms used herein in the specification of the disclosure are for describing specific embodiments only, and are not intended to limit this disclosure. As used herein, the term "and/or" includes any and all combinations of one or more of the associated listed items.

Figure 1:
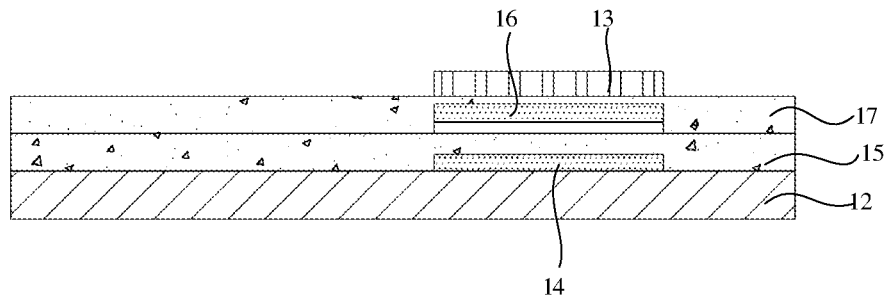
FIG. 1 is a schematic view of a substrate with a protrusion formed by a thin-film transistor (TFT) driving array.
Figure 2:
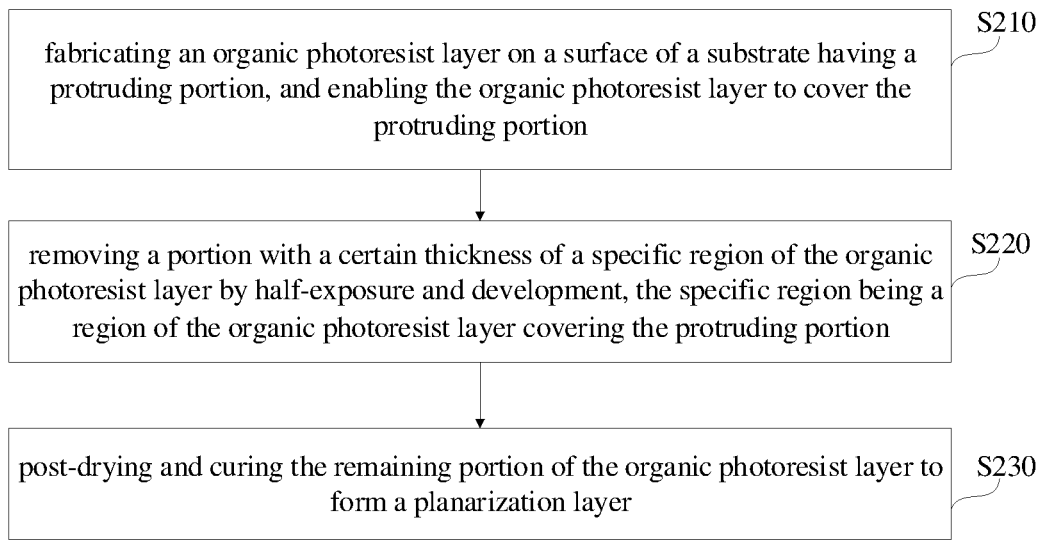
FIG. 2 is a flowchart of a method for fabricating a substrate of a light-emitting device according to an embodiment.

Referring to FIG. 2, a method for fabricating a substrate of a light-emitting device according to an embodiment includes the following steps.

Figure 3:
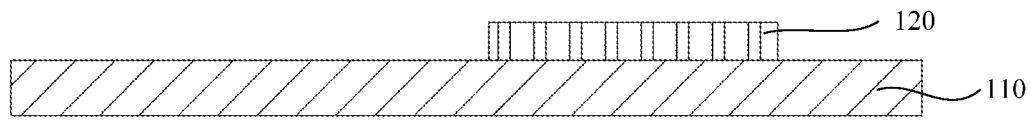
FIG. 3 is a simplified diagram of a substrate with a protrusion formed by a TFT driving array.
Figure 4:
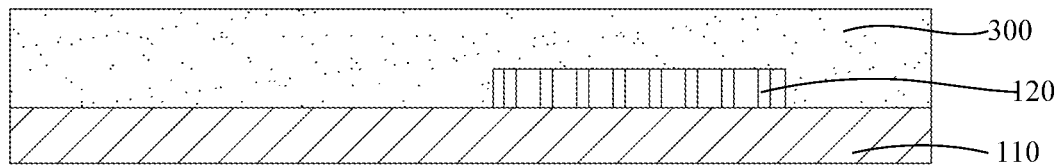
FIG. 4 is a schematic diagram of fabricating an organic photoresist layer on a structure shown in FIG. 3.

At Step S210, as shown in FIGS. 3 and 4, an organic photoresist layer 300 is fabricated on a substrate 110 having a protruding portion 120.

Figure 5:
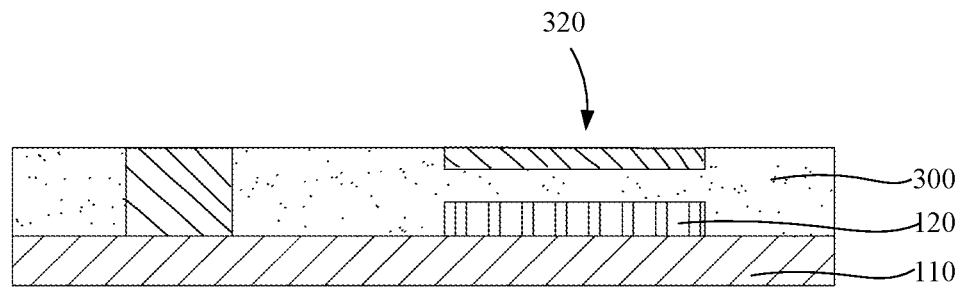
FIG. 5 is a schematic diagram of an exposure which is performed on a structure shown in FIG. 4.
Figure 6:
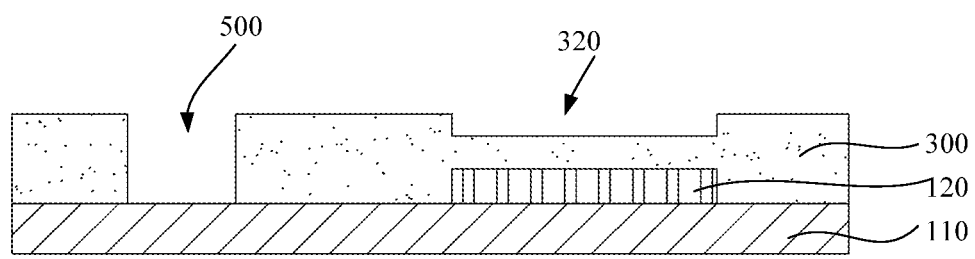
FIG. 6 is a schematic diagram of removing a portion with a certain thickness of organic photoresist material by development and fabricating a via hole on a structure shown in FIG. 5.

At Step S220, as shown in FIGS. 5 and 6, a portion with a certain thickness of a specific region 320 of the organic photoresist layer 300 is removed by half-exposure and development. The specific region 320 is a region of the organic photoresist layer 300 covering the protruding portion 120.

Figure 7:
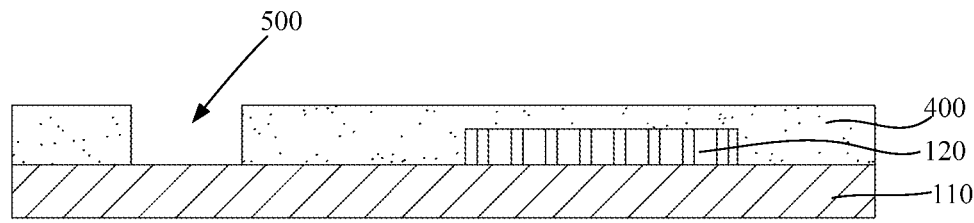
FIG. 7 is a schematic diagram of post-drying and curing a structure shown in FIG. 6 to form a planarization layer.

At Step S230, as shown in FIG. 7, the remaining portion of the organic photoresist layer 300 is post-dried and cured to form a planarization layer 400.

Specifically, the organic photoresist layer 300 is formed by coating a coating layer including an organic photoresist material and a solvent on the substrate 110, and removing the solvent by pre-drying. The coating material including the organic photoresist material and the solvent has good fluidity, so that a surface of the substrate 110 can be effectively flattened when it is in a liquid film state.

In one of the examples, the protruding portion 120 is formed by protruding a TFT driving array on the substrate 110 from the surface of the substrate 110. Specifically, the protruding portion 120 is formed by capacitors, wirings, etc. generated during the pre-fabrication process of the thin film transistor. More specifically, the protruding portion 120 is formed by a capacitor structure composed of a light-shielding layer/gate insulating layer/source-drain.

In one of the examples, a thickness C of the specific region of the organic photoresist layer 300 removed by half-exposure and development satisfies: $C=m \cdot (D/X-D)$. Where, D is a height of the protruding portion 120 protruding from the surface of the substrate 110, and X is a curing shrinkage rate of the material of the organic photoresist layer. $0.5 < m \le 1.5$, that is, $0.5 \times (D/X-D) < C \le 1.5 \times (D/X-D)$. The thickness of the removed organic photoresist material is within this thickness range, which can reduce the level difference formed by directly curing the conventional organic photoresist material.

In one of the examples, $0.8 < m \le 1.2$, that is, the thickness C of the specific region of the organic photoresist layer 300 satisfies: $0.8 \times (D/X-D) \le C \le 1.2 \times (D/X-D)$. The thickness of the removed organic photoresist material is within this thickness range, which can further reduce the level difference after the organic photoresist layer 300 is cured.

In one of the examples, $0.9 < m \le 1.1$, that is, the thickness C of the specific region of the organic photoresist layer 300 satisfies: $0.9 \times (D/X-D) \le C \le 1.1 \times (D/X-D)$. The thickness of the removed organic photoresist material is within this thickness range, which can further reduce the level difference after the organic photoresist layer 300 is cured.

In one of the examples, $0.95 < m \le 1.05$, that is, the thickness C of the specific region of the organic photoresist layer 300 satisfies: $0.95 \times (D/X-D) \leq C \leq 1.05 \times (D/X-D)$. The thickness of the removed organic photoresist material is within this thickness range, which can further reduce the level difference after the organic photoresist layer 300 is cured.

In one of the examples, $m \leq 1$, that is, the thickness C of the specific region of the organic photoresist layer 300 satisfies: $C \leq D/X-D$. The thickness of the removed organic photoresist material is within this thickness range, which can further reduce the level difference after the organic photoresist layer 300 is cured.

In a specific example, $m=1$, that is, the thickness C of the specific region of the organic photoresist layer 300 satisfies: $C = D/X-D$. Removing the organic photoresist material with this thickness can cause the height of the specific region to be flush with that of other regions, thereby forming a planarization layer. A first electrode is deposited on this planarization layer, and finally a flat first electrode with almost no level difference can be obtained, thereby improving the uniformity of light emission of the light-emitting device.

It can be understood that, if the height of the protruding portion 120 protruding from the surface of the substrate 110 is unknown, the method for fabricating the substrate of the light-emitting device further includes measuring the height of the protruding portion 120 protruding from the surface of the substrate 110.

It can be understood that, if the curing shrinkage rate of the organic photoresist material is unknown, the method for fabricating the substrate of the light-emitting device further includes measuring the curing shrinkage rate of the organic photoresist material.

In one of the examples, the method for fabricating the substrate of the light-emitting device further includes: fabricating a via hole 500, configured for electrically connecting the first electrode to a source-drain of the TFT driving array, in a region of the organic photoresist layer 300 other than the specific region. Specifically, the via hole 500 passing through the organic photoresist layer 300 can be fabricated by exposure and development.

In one of the examples, the organic photoresist material is a positive organic photoresist material. The exposed portion of the positive organic photoresist material will be removed during the development process, while it is easy to control the thickness of the photoresist film layer removed during the development by adjusting the exposure amount, so as to facilitate the formation of the organic photoresist films with different thicknesses through the half-exposure process, and a planarization layer 400 is formed by combining a post-drying and curing process.

In one of the examples, a temperature for the pre-drying is in a range from 60° C. to 100° C., and a time for the pre-drying is in a range from 0.2 h to 0.8 h.

In one of the examples, a temperature for the post-drying and curing is in a range from 200° C. to 250° C., and a time for the post-drying and curing is in a range from 0.5 h to 2 h.

More specifically, as shown in FIGS. 3 to 7, a method for fabricating a substrate of a light-emitting device according to an example includes the following steps.

As shown in FIG. 3, a substrate 110 is provided. The substrate 110 includes a TFT array protrusion 120. A height of the TFT array protrusion 120 protruding from a surface of the substrate 110 is D.

A coating layer including an organic photoresist material and a solvent is coated on the substrate 110, so that the coating layer covers the TFT array protrusion 120. The curing shrinkage rate of the organic photoresist material is X.

As shown in FIG. 4, the coating layer is pre-dried to remove the solvent, and the organic photoresist material is remained to form an organic photoresist layer 300.

As shown in FIG. 5, the organic photoresist material on the region 320 (i.e., a specific region) of the organic photoresist layer 300 covering the protruding portion 120, the organic photoresist material layer with a thickness of C, is half-exposed, and a region on the organic photoresist layer 300 corresponding to the source-drain of the TFT array is fully exposed.

As shown in FIG. 6, a via hole 500 for electrically connecting the first electrode to the source-drain electrode of the TFT driving array is formed by development, and the organic photoresist material layer with the thickness of C is removed. Where $C=D/X-D$.

As shown in FIG. 7, the organic photoresist layer 300 obtained in step S230 is post-dried and cured to form a planarization layer 400.

Further, the present disclosure further provides a substrate of a light-emitting device, and the substrate is fabricated by the method for fabricating the substrate of the light-emitting device according to any one of the above examples.

Further, the present disclosure further provides a light-emitting device, which includes the above-mentioned substrate 110 of the light-emitting device, a first electrode, a light-emitting functional layer, and a second electrode. The first electrode is disposed on the planarization layer 400. The light-emitting functional layer is disposed on the first electrode. The second electrode is disposed on the light-emitting functional layer. The light-emitting device may be an upright structure or an inverted structure. If the optical device is an upright structure, the first electrode is an anode and the second electrode is a cathode. If the optical device is an inverted structure, the first electrode is a cathode and the second electrode is an anode.

In one of the examples, the light-emitting device is a top-emitting type of light-emitting device. The light-emitting device may be an OLED, a QLED, or the like.

Figure 8:
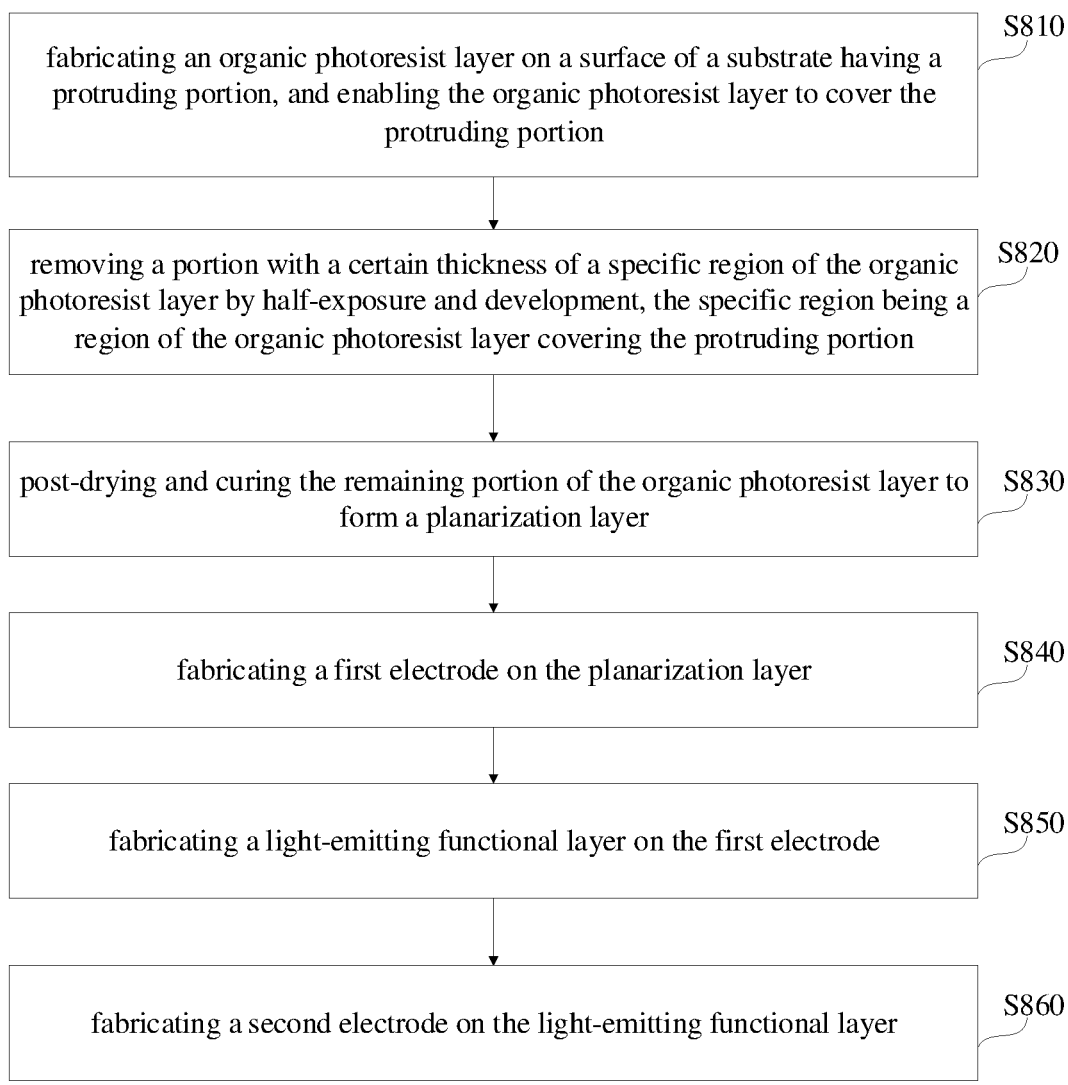
FIG. 8 is a flowchart of a method for fabricating a substrate of a light-emitting device according to another embodiment.

Further, referring to FIG. 8, the present disclosure further provides a method for fabricating a light-emitting device, which includes the following steps.

At Step S810, an organic photoresist layer is fabricated on a substrate having a protruding portion, so that the organic photoresist layer covers the protruding portion.

At Step S820, a portion with a certain thickness of a specific region of the organic photoresist layer is removed by half-exposure and development, where the specific region is a region corresponding to the protruding portion on the organic photoresist layer.

At Step S830, the remaining portion of the organic photoresist layer is post-dried and cured to form a planarization layer.

At Step S840, a first electrode is fabricated on the planarization layer.

At Step S850, a light-emitting functional layer is fabricated on the first electrode.

At Step S860, a second electrode is fabricated on the light-emitting functional layer.

The present disclosure will be further described below by taking a method for fabricating a substrate of a light-emitting device according to a specific embodiment as an example.

First Embodiment

As shown in FIGS. 3 and 4, a substrate 110 was provided. The substrate 110 included a TFT array protrusion 120. A height D of the TFT array protrusion 120 protruding from a surface of the substrate 110 was 1.5 μm. A coating layer including an organic photoresist material and a solvent was coated on the substrate 110, so that the coating layer covered the TFT array protrusion 12. The curing shrinkage rate X of the organic photoresist material was 0.5.

The coating layer was pre-dried to remove the solvent, and a temperature for the pre-drying was 80° C., and a time for the pre-drying was 0.5 h. The organic photoresist material was remained to form an organic photoresist layer 300. A thickness of a region of the organic photoresist layer 300 other than a region (specific region) covering the TFT array protrusion 120 was 6 μm. A thickness of a portion of the organic photoresist layer 300 covering the region (specific region) of the TFT array protrusion 120 was 6−D=4.5 μm.

As shown in FIG. 5, the organic photoresist material in the specific region of the organic photoresist layer 300 was half-exposed. A thickness of the half-exposed portion was C=D/X−D=1.5 μm. A region on the organic photoresist layer 300 corresponding to a source-drain of the TFT array were fully exposed.

As shown in FIG. 6, a via hole 500 for electrically connecting an anode to the source-drain of the TFT driving array was formed by development. A portion with a thickness of C=1.5 μm, of the specific region of the organic photoresist layer 300 was removed, and the remaining portion of the specific region of the organic photoresist layer had a thickness of 3 μm.

As shown in FIG. 7, the organic photoresist layer 300 obtained in step S3 was post-dried and cured to form a planarization layer 400. After post-drying and curing, a thickness of the planarization layer 400 that was not located in a region of the array protrusion was 6 μm×0.5=3 μm, a height of the planarization layer that was located in the region of the array protrusion was 3×0.5=1.5 μm, and the overall height of the region of the array protrusion was D+1.5 μm=3 μm, which was the same as the thickness of the formed planarization layer 400.

Theoretically, the planarization layer without level difference can be achieved. In this case, the level difference of the surface of the substrate 110 that was actually fabricated is about 50 nm.

In the above method for fabricating the substrate of the light-emitting device, the organic photoresist layer is formed by pre-drying the coating layer including the organic photoresist material and the solvent to remove the solvent, so as to avoid the volatilization of the solvent from affecting the uneven film formation during the direct curing. Then, the organic photoresist material of the portion with a certain thickness of a region on the organic photoresist layer, corresponding to the protruding portion, is removed by half-exposure and development, which reduces the effect of uneven film formation caused by the difference in shrinkage between the organic photoresist material of this region and the organic photoresist material of other region during curing. As a result, the planarization layer with higher flatness is formed. The first electrode is deposited on this planarization layer, finally the flat first electrode with almost no level difference can be obtained, thereby improving the uniformity of light emission of the light-emitting device.

In particular, when the thickness C of the removed organic photoresist material on the specific region is equal to D/X−D (D is the height of the protruding portion protruding from the surface of the substrate, X is the curing shrinkage rate of the organic photoresist material), after post-drying and curing, the height of the formed film on this region can be flush with the height of the formed film on other regions.

The technical features of the above-described embodiments can be combined arbitrarily. To simplify the description, not all possible combinations of the technical features in the above embodiments are described. However, all of the combinations of these technical features should be considered as being fallen within the scope of the present disclosure, as long as such combinations do not contradict with each other.

The foregoing embodiments merely illustrate some embodiments of the present disclosure, and descriptions thereof are relatively specific and detailed. However, it should not be understood as a limitation to the patent scope of the present disclosure. It should be noted that, a person of ordinary skill in the art may further make some variations and improvements without departing from the concept of the present disclosure, and the variations and improvements falls in the protection scope of the present disclosure. Therefore, the protection scope of the present disclosure shall be subject to the appended claims.

What is claimed is:

1. A method for fabricating a substrate of a light-emitting device, the method comprising:
   fabricating an organic photoresist layer on a surface of a substrate having a protruding portion;
   enabling the organic photoresist layer to cover the protruding portion;
   removing a portion with a certain thickness of a specific region of the organic photoresist layer by half-exposure and development, the specific region being a region of the organic photoresist layer covering the protruding portion; and
   post-drying and curing the remaining portion of the organic photoresist layer to form a planarization layer,
   wherein in the removing the portion with the certain thickness of the specific region of the organic photoresist layer by half-exposure and development, the thickness is calculated according to a condition (I):

$$C = m \cdot (D/X - D), \quad (I)$$

wherein C is the thickness of the portion of the specific region of the organic photoresist layer removed by half-exposure and development, D is a height of the protruding portion protruding from the surface of the substrate, and X is a curing shrinkage rate of a material of the organic photoresist layer, 0.5<m≤1.5.

2. The method according to claim 1, wherein 0.8<m≤1.2.

3. The method according to claim 2, wherein m=1.

4. The method according to claim 1, further comprising, prior to the post-drying and curing:
   fabricating a via hole in a region of the organic photoresist layer other than the specific region,
   wherein the via hole is configured for being electrically connected to a source-drain of a thin-film transistor (TFT) driving array.

5. The method according to claim 1, further comprising, prior to the post-drying and curing:
   fabricating a via hole in a region of the organic photoresist layer other than the specific region,
   wherein the via hole is configured for being electrically connected to a source-drain of a thin-film transistor (TFT) driving array.

6. The method according to claim 2, further comprising, prior to the post-drying and curing:
   fabricating a via hole in a region of the organic photoresist layer other than the specific region, wherein the via hole is configured for being electrically connected to a source-drain of a thin-film transistor (TFT) driving array.

7. The method according to claim 3, further comprising, prior to the post-drying and curing:
fabricating a via hole in a region of the organic photoresist layer other than the specific region,
wherein the via hole is configured for being electrically connected to a source-drain of a thin-film transistor (TFT) driving array.

8. The method according to claim 1, wherein a thin-film transistor (TFT) driving array is disposed on the substrate, and the protruding portion is formed by protruding the TFT driving array from the surface of the substrate.

9. The method according to claim 1, wherein a thin-film transistor (TFT) driving array is disposed on the substrate, and the protruding portion is formed by protruding the TFT driving array from the surface of the substrate.

10. The method according to claim 2, wherein a thin-film transistor (TFT) driving array is disposed on the substrate, and the protruding portion is formed by protruding the TFT driving array from the surface of the substrate.

11. The method according to claim 3, wherein a thin-film transistor (TFT) driving array is disposed on the substrate, and the protruding portion is formed by protruding the TFT driving array from the surface of the substrate.

12. The method according to claim 1, wherein the organic photoresist layer is made of a positive organic photoresist material.

13. The method according to claim 1, wherein the organic photoresist layer is made of a positive organic photoresist material.

14. The method according to claim 2, wherein the organic photoresist layer is made of a positive organic photoresist material.

15. The method according to claim 3, wherein the organic photoresist layer is made of a positive organic photoresist material.

16. A substrate of a light-emitting device, configured to be fabricated by the method according to claim 1.

17. A light-emitting device, comprising:
the substrate according to claim 16;
a first electrode disposed on the planarization layer;
a light-emitting functional layer disposed on the first electrode; and
a second electrode disposed on the light-emitting functional layer.

18. A method for fabricating a light-emitting device, the method comprising:
fabricating an organic photoresist layer on a surface of a substrate having a protruding portion;
enabling the organic photoresist layer to cover the protruding portion;
removing a portion with a certain thickness of a specific region of the organic photoresist layer by half-exposure and development, the specific region being a region of the organic photoresist layer covering the protruding portion;
post-drying and curing the remaining portion of the organic photoresist layer to form a planarization layer;
fabricating a first electrode on the planarization layer;
fabricating a light-emitting functional layer on the first electrode; and
fabricating a second electrode on the light-emitting functional layer,
wherein in the removing the portion with the certain thickness of the specific region of the organic photoresist layer by half-exposure and development, the thickness is calculated according to a condition (I):

$$C = m \cdot (D/X - D), \qquad (I)$$

wherein C is the thickness of the portion of the specific region of the organic photoresist layer removed by half-exposure and development, D is a height of the protruding portion protruding from the surface of the substrate, and X is a curing shrinkage rate of a material of the organic photoresist layer, $0.5 < m \leq 1.5$.

* * * * *